United States Patent
Kamoshida

(10) Patent No.: US 8,775,899 B2
(45) Date of Patent: Jul. 8, 2014

(54) ERROR CORRECTION DEVICE, ERROR CORRECTION METHOD, AND PROCESSOR

(75) Inventor: Shiro Kamoshida, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 182 days.

(21) Appl. No.: 13/566,285

(22) Filed: Aug. 3, 2012

(65) Prior Publication Data

US 2013/0073921 A1 Mar. 21, 2013

(30) Foreign Application Priority Data

Sep. 20, 2011 (JP) ................. 2011-205305

(51) Int. Cl.
*H03M 13/00* (2006.01)
*H03M 13/11* (2006.01)
*H03M 13/09* (2006.01)
*H03M 13/29* (2006.01)

(52) U.S. Cl.
CPC .............. *H03M 13/11* (2013.01); *H03M 13/09* (2013.01); *H03M 13/2948* (2013.01)
USPC .... 714/758; 714/764; 714/777; 714/E11.032; 714/E11.054

(58) Field of Classification Search
CPC .... G06F 11/1072; G11C 11/56; G11C 29/00; H03M 13/11; H03M 13/09; H03M 13/19; H03M 13/2906; H03M 13/2927; H03M 13/2948
USPC .......... 714/E11.039, 758, 764, E11.032, 773, 714/777
See application file for complete search history.

(56) References Cited

U.S. PATENT DOCUMENTS

| 4,201,337 | A | * | 5/1980 | Lewis et al. ................... 714/785 |
| 2002/0174397 | A1 | * | 11/2002 | Furukawa ..................... 714/764 |
| 2005/0188150 | A1 | * | 8/2005 | Ware et al. ..................... 711/105 |
| 2009/0037796 | A1 | * | 2/2009 | Kosaki et al. ................. 714/785 |
| 2011/0119559 | A1 | | 5/2011 | Kamoshida |

FOREIGN PATENT DOCUMENTS

| JP | 56-094596 | 7/1981 |
| JP | 2011-109476 | 6/2011 |

* cited by examiner

*Primary Examiner* — Guy Lamarre
(74) *Attorney, Agent, or Firm* — Fujitsu Patent Center

(57) ABSTRACT

An error correction device includes: an error correction code generator that generates, from information unit data of data with a parity bit which includes m bytes of information unit data in which each byte has n bits of data and a total of m parity bits where 1 bit is provided for every 1 byte of the information unit data, a bit other than a bit corresponding to the parity bit out of bits constituting an error correction code used for correcting an error in the information unit data; an error detector that detects an error in the information unit data by generating an exclusive-OR of the data with a parity bit; and an error corrector that corrects an error in the information unit data by using a parity bit included in the data with a parity bit and the bit generated by the error correction code generator.

9 Claims, 8 Drawing Sheets

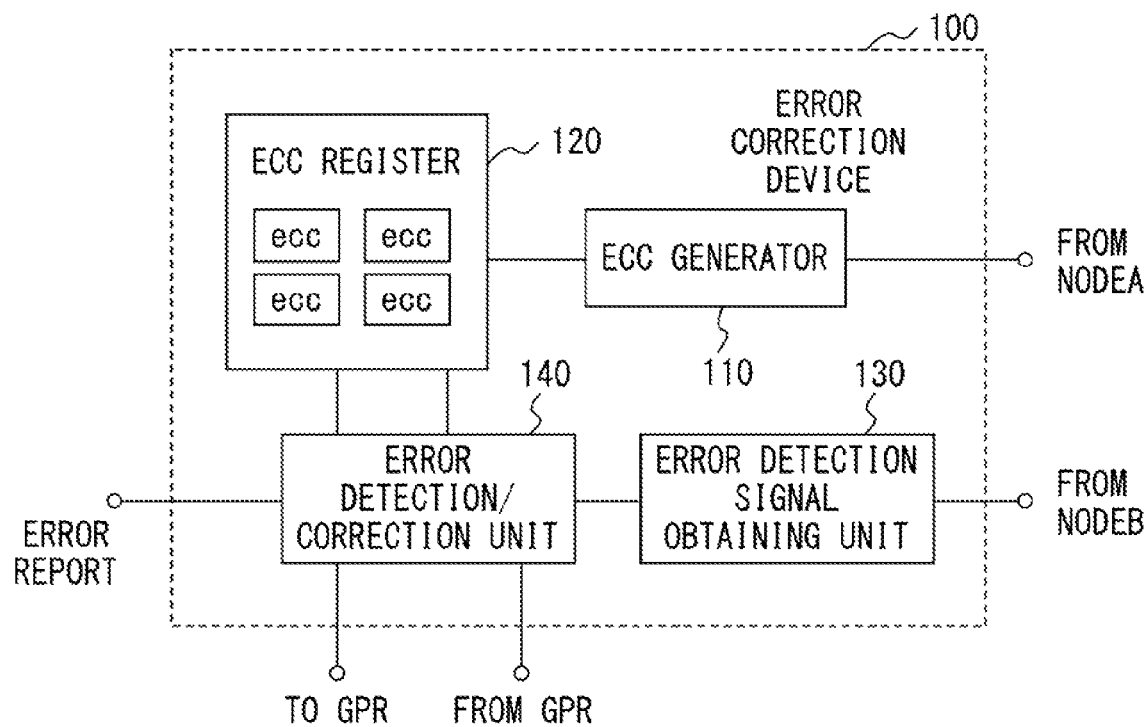
F I G. 4

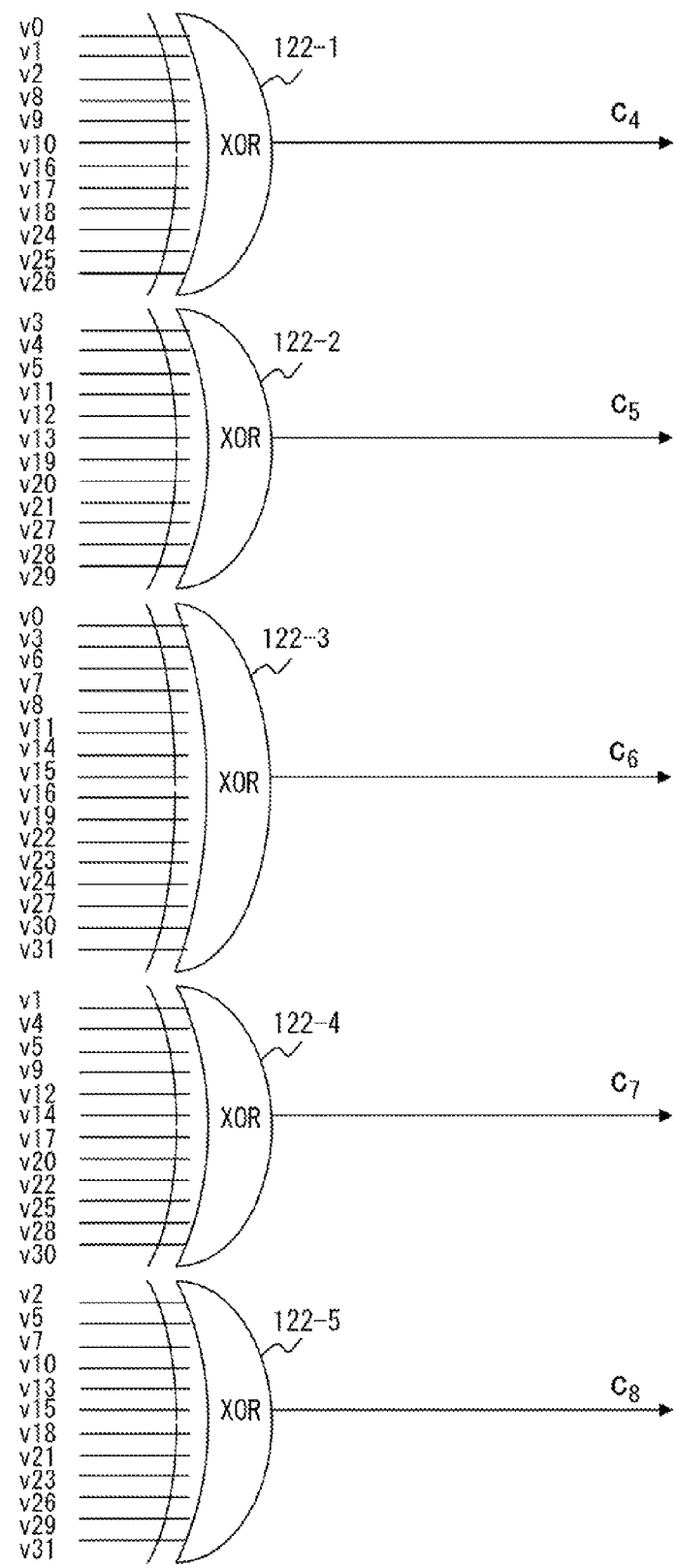
F I G. 6

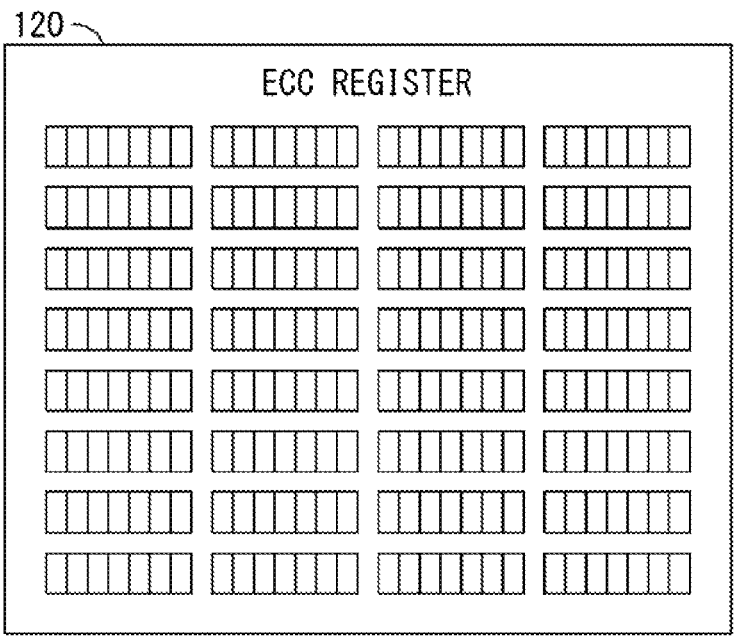
(A) CASES WHERE PARITY BIT IS NOT USED FOR ECC
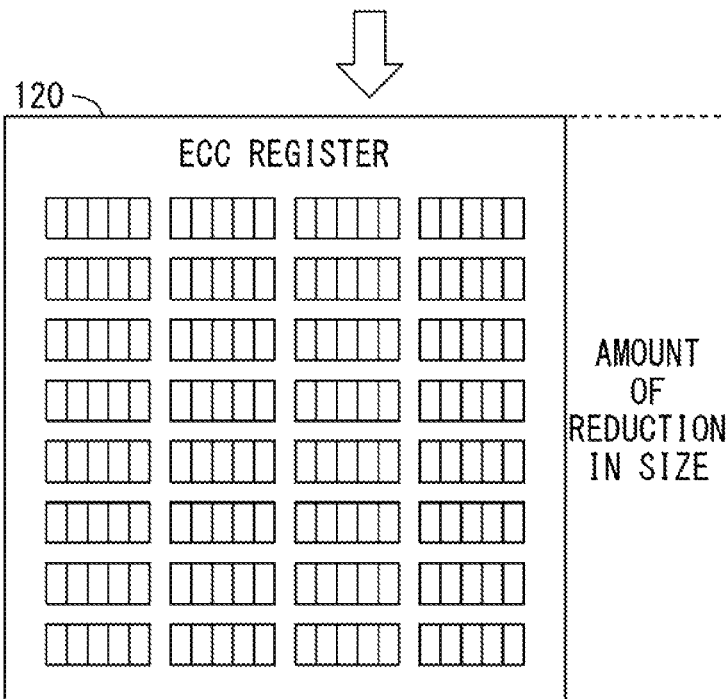
(B) CASES WHERE PARITY BIT IS USED FOR ECC
F I G. 8

ERROR CORRECTION DEVICE, ERROR CORRECTION METHOD, AND PROCESSOR

CROSS-REFERENCE TO RELATED APPLICATION

This application is based upon and claims the benefit of priority of the prior Japanese Patent Application No. 2011-205305, filed on Sep. 20, 2011, the entire contents of which are incorporated herein by reference.

FIELD

The embodiments discussed herein are related to an error correction device, an error correction method, and a processor.

BACKGROUND

For example, in order to detect a permanent fault caused in the manufacturing process of a circuit, or in order to detect and correct a data error caused by a software error or the like in which data is inverted as voltage fluctuates during the use of a product or as an c-ray or a neutron ray enter a circuit, there are some cases in which the circuit is provided with another circuit for detecting and correcting the data error. This function of detecting and correcting a data error is referred to as the RAS (Reliability, Availability and Serviceability) function or the like.

In order to detect and correct a data error caused in a circuit, it is necessary that the data on which error detection and error correction are performed be made redundant and that the circuit be provided with another circuit for realizing the RAS function. However, the size and content of the redundant portion added to the data vary depending on the purpose of detecting and correcting a data error.

For example, 1 parity bit is given to 8 bits of information data. Such a parity bit is produced by performing an XOR (exclusive-OR) operation for each bit of the information data. At the same time, an error detector is provided for performing an XOR operation between each bit of the information data and a parity check bit. Due to this configuration, it becomes possible to detect 1 bit of data error. This RAS function, which is referred to as a parity check function, is suitable for cases in which the frequency of data error occurrence is low, and even if several error bits occur, there is no tendency for that error to be concentrated at neighboring bits, and it is also suitable for cases in which an error may be recovered by performing an operation again or by obtaining the data again. This parity check function is often used for circuits that do not use many resources or execution latency for the RAS circuit (for example, a functional unit).

On the other hand, registers that require the self repair of data are often provided with an RAS function that is capable of not only detecting an error but also correcting an error. For example, a 1 bit of error correction (SEC: Single bit Error Correct) circuit for 32 bits of information data may realize the RAS function by adding 6 check bits to the information data as a redundant portion (for example, a Hamming code). Moreover, if an extended Hamming code where the number of check bits is further increased by 1 bit is used, the function of 2 bits of error detection and 1 bit of error correction (SECDED: Single bit Error Correct and Double bit Error Detect) may be realized. However, circuits that realize such RAS functions involve a large number of elements compared with data error detectors that use the above-mentioned parity check, and thus the detection and correction of a data error causes a certain degree of latency.

In relation to the above-mentioned RAS function, some techniques are known.

One such technique is to generate data with error detection/correction code using a simple configuration. In this technique, data with an error detection bit includes m bytes of an information portion of which each byte has n bits as well as a redundant portion of m bits of error detection provided in the m bytes of the information portion, and an exclusive-OR operation is firstly performed on the m bytes of the information portion of the data with error detection bits. Then, a portion of $\log_2$ (n+1) bits is generated from the redundant portion of the data with error detection/correction code, and the generated portion and the error detection bit are input to generate other portions of m bits.

Another one of such techniques is to provide a memory with a parity check function and an SECDED capability, and to use one of the parity check function and the SECDED capability depending on a control signal.

Note that the techniques disclosed in the following documents are also known.

Document 1: Japanese Laid-open Patent Publication No. 2011-109476

Document 2: Japanese Laid-open Patent Publication No. 56-094596

There are also some cases in which the capability of an RAS function needs to be improved in existing circuits in which the RAS function has already been installed in order to deal with, for example, the increase in software errors caused due to fine processing technology.

FIG. 1 will be explained below. FIG. 1 illustrates an example of the configuration of a processor having a parity check function.

The processor 1 of FIG. 1 includes a functional unit 2, a general purpose register (GPR) 3, and a 1-bit error detector 4.

The functional unit 2 internally includes a parity bit generation circuit and a parity check circuit for a parity check function. Data with a parity bit is input to or output from the functional unit 2. Note that the data with the parity bit is the data that includes information unit data in which the original information of the data is contained and a parity bit of the information unit data.

Regarding the information unit data, it is assumed in the following explanations that each byte is configured by n bits of data, and that the number of bytes is m (note that both m and n indicate an integer that is equal to or larger than 1). Moreover, it is assumed that the data with a parity bit includes 1 parity bit for every 1 byte that constitutes the information unit data. In other words, it is assumed that the data with a parity bit includes m*n bits of information unit data and n parity bits.

The general purpose register 3 includes a plurality of registers in which the data with a parity bit that is input to or output from the functional unit 2 is stored. In FIG. 3, "data" indicates the region in which the information unit data is stored, and "p" indicates the region in which the parity bit is stored.

The 1-bit error detector 4 is a circuit that performs a parity check to detect an error in the data with a parity bit, which is read from the general purpose register 3 by the functional unit 2. More specifically, the 1-bit error detector 4 is a circuit that performs an XOR operation for each m bytes of data between n pieces of bit data constituting 1 byte of data in the data with a parity bit and a parity bit for the 1 byte of data.

When arithmetic processing is performed in the processor 1 of FIG. 1, the functional unit 2 firstly reads the data with a parity bit, which includes the information unit data to be processed, from the general purpose register 3. At the same time, the 1-bit error detector 4 performs a parity check on the data with a parity bit, which is read from the general purpose register 3 by the functional unit 2.

Here, if a data error is detected in the data with a parity bit, the 1-bit error detector 4 outputs an error detection signal, which indicates the detection of a data error, as an "error report". A controller (not illustrated) that controls the processor 1 of FIG. 1 performs control processing for recovering the error in the data with a parity bit stored in the general purpose register 3 when an error detection signal output from the 1-bit error detector 4 is received. More specifically, once an error detection signal is received, the controller controls the processor 1 to read again from the general purpose register 3 the data with a parity bit in which a data error is detected. Then, the controller controls the functional unit 2 to store the obtained data with a parity bit in the general purpose register 3.

On the other hand, the functional unit 2 may independently perform a parity check on the data with a parity bit read from the general purpose register 3. When no error is detected, the functional unit 2 retrieves the information unit data from the data with a parity bit read from the general purpose register 3 to perform arithmetic processing, thereby obtaining the data of an operation result. Then, a parity bit is generated for the data of an operation result, and the data with a parity bit obtained by adding the generated parity bit to the data of an operation result is stored in the general purpose register 3.

Here, a technique of changing the parity check function of the processor 1 into the SEC capability or the SECDED capability with the purpose of improving the RAS function provided for the processor 1 of FIG. 1 will be discussed.

FIG. 2 will be explained below. FIG. 2 illustrates an example of the configuration of a processor in which the RAS function is improved on the processor 1 of FIG. 1.

In a processor 5 of FIG. 2, the 1-bit error detector 4 is deleted from the existing configuration of FIG. 1, and an error detection/correction circuit 6, a parity generation circuit 7, and an ECC (Error Correcting Code) generation circuit 8 are additionally comprised. Moreover, in the processor 5, instead of the data with a parity bit, data with ECC, which is the information unit data to which an ECC used for the SEC capability or the SECDED capability is added, is stored in the general purpose register 3.

The error detection/correction circuit 6 receives the data with ECC that is read from the general purpose register 3 by the functional unit 2, and detects and corrects an error in the data with ECC by using the ECC included therein. When an error is corrected, the error detection/correction circuit 6 stores the corrected data with ECC in the general purpose register 3 in which the data with ECC was stored.

The parity generation circuit 7 receives error-free data with ECC from the error detection/correction circuit 6, and generates a parity bit for the information unit data included in the data with ECC. Then, the parity generation circuit 7 inputs to the functional unit 2 the data with a parity bit obtained by adding the parity bit to the information unit data. Due to the provision of the parity generation circuit 7, it becomes unnecessary to change the circuitry of the existing functional unit 2 in order to change the parity check function.

The ECC generation circuit 8 generates an ECC, which is used for the SEC capability or the SECDED capability, from the entirety of the m bytes of information unit data included in the data with a parity bit that is output from the functional unit 2 so as to store the result of arithmetic processing in the general purpose register 3. Then, the data with ECC is obtained by adding the generated ECC to the data of an operation result that is included in the data with a parity bit output from the functional unit 2, and the obtained data with ECC is stored in the general purpose register 3.

In the configuration of the processor 5 of FIG. 2, the error detection/correction circuit 6, the parity generation circuit 7, and the ECC generation circuit 8 are inserted between the functional unit 2 and the general purpose register 3. For this reason, latency may be caused in the data transfer between the functional unit 2 and the general purpose register 3.

Moreover, in the configuration of the processor 5 of FIG. 2, it is necessary for the general purpose register 3 to store the data with ECC of which the number of bits is larger than that of the data with a parity bit.

For example, it is assumed that the information unit data is the data where each byte is configured by 8 bits of data and the number of bytes is four, i.e., it is assumed that the information unit data is the data where there are thirty two bits. In this case, the number of parity bits included in the data with a parity bit is four. Here, if it is desired that the SEC capability for 32 bits of information unit data be realized, the number of bits of the ECC needs to be at least six. Moreover, if it is desired that the SECDED capability for 32 bits of information unit data be realized, there needs to be at least seven bits of the ECC.

As described above, if the RAS function is upgraded from a parity check to an SEC capability or an SECDED capability, the number of bits of the redundant data required for the RAS function increases. For this reason, if the configuration of FIG. 1 is changed to the configuration of FIG. 2, the general purpose register 3 maybe replaced so as to be capable of storing a larger number of bits. As described above, it is necessary to make a significant change to the existing configuration of the processor 1 of FIG. 1 if it is desired to configure the processor 5 of FIG. 2.

SUMMARY

According to an aspect of the embodiment, an error correction device includes: an error correction code generator that generates, from information unit data of data with a parity bit which includes m bytes of information unit data in which each byte has n bits of data and a total of m parity bits where 1 bit is provided for every 1 byte of the information unit data, a bit other than a bit corresponding to the parity bit out of bits constituting an error correction code used for correcting an error in the information unit data; an error detector that detects an error in the information unit data by generating an exclusive-OR of the data with a parity bit; and an error corrector that corrects an error in the information unit data by using a parity bit included in the data with a parity bit and the bit generated by the error correction code generator when the error is detected in the information unit data by the error detector.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

BRIEF DESCRIPTION OF DRAWINGS

FIG. 4 is a block diagram of the error correction device of FIG. 3.

FIG. 6 illustrates the second example of the circuitry of an ECC generation circuit.

FIG. 8 is an explanatory schematic diagram illustrating an advantageous effect of the reduction of an ECC register in circuit size.

DESCRIPTION OF EMBODIMENTS

Preferred embodiments of the present invention will be explained with reference to accompanying drawings.

Figure 3:
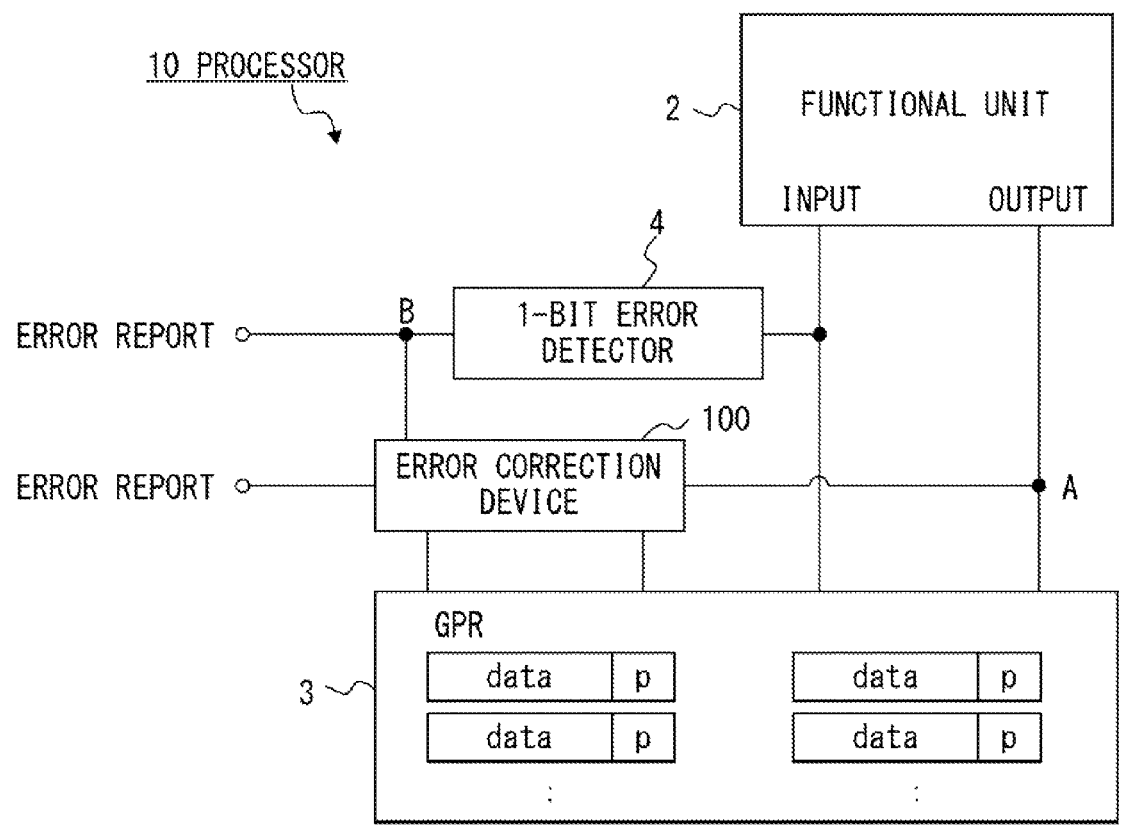
FIG. 3 is a block diagram of a processor where the performance of the RAS function is improved by adding an error correction device to the processor.

Firstly, FIG. 3 will be explained. FIG. 3 is a block diagram of a processor where the performance of The RAS function is improved by adding an error correction device to the processor.

Figure 1:
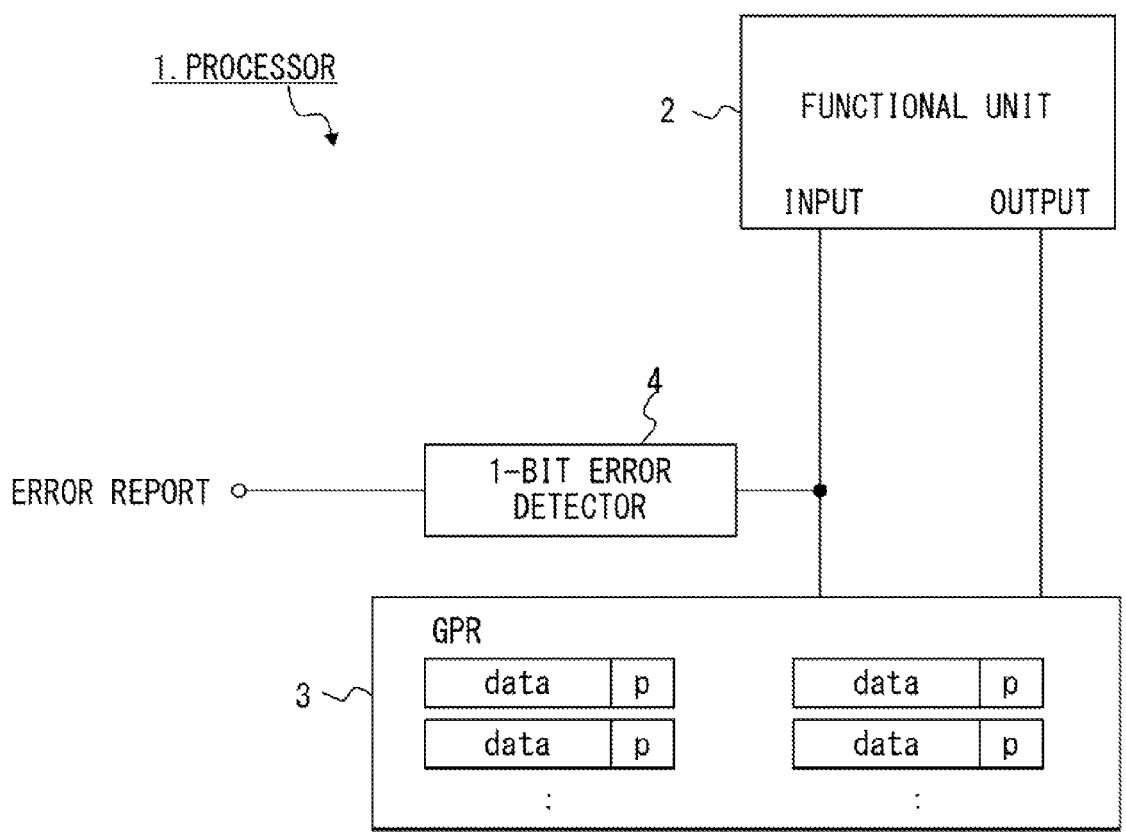
FIG. 1 illustrates an example of the configuration of a processor having a parity check function.
Figure 2:
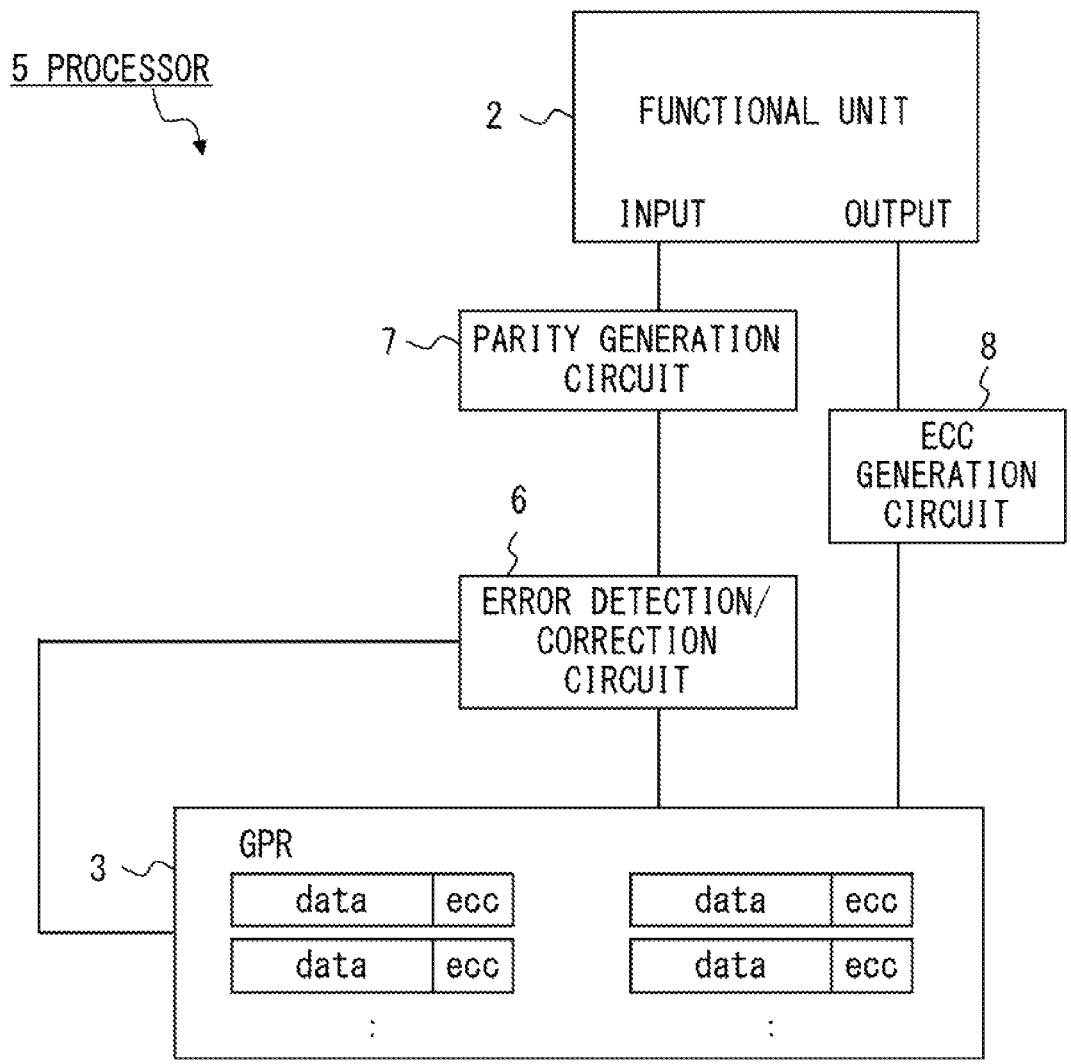
FIG. 2 illustrates an example of the configuration of a processor in which the RAS function is improved.

The processor 10 of FIG. 3 is configured by adding an error correction device 100 to the processor 1 of FIG. 1.

The functional unit 2 internally includes a parity bit generation circuit and a parity check circuit for a parity check function, and inputs and outputs data with a parity bit that includes the above-mentioned m*n bits of information unit data and m parity bits.

The general purpose register 3 stores the data with a parity bit that is input to the functional unit 2 or output from the functional unit 2, and two or more general purpose registers 3 are present in the example of FIG. 3.

The 1-bit error detector 4 is a circuit that performs a parity check to detect an error in the data with a parity bit, which is read from the general purpose register 3 by the functional unit 2. More specifically, the 1-bit error detector 4 is a circuit that performs an XOR operation for each m bytes of data between n pieces of bit data constituting 1 byte of data in the read data with a parity bit and a parity bit for the 1 byte of data. Here, when a data error is detected in the data with a parity bit, the 1-bit error detector 4 outputs an error detection signal that indicates the detection of a data error.

As described above, the functional unit 2, the general purpose register 3, and the 1-bit error detector 4 provided for the processor 10 of FIG. 3 are the same as those provided for the processor 1 of FIG. 1.

The error correction device 100 corrects data by using the SEC capability or the SECDED capability. The error correction device 100 corrects a data error that is stored in the general purpose register 3 when an error detection signal output from the 1-bit error detector 4 is received. Note that if two uncorrectable data error bits are detected when the SECDED capability is adopted as the RAS function, the error correction device 100 outputs an error detection signal, which indicates the detection of a data error, as an "error report". This detection signal is transmitted to a controller (not illustrated) that is similar to the processor 1 of FIG. 1, and control processing is performed to recover the error.

The controller (not illustrated) that controls the processor 10 of FIG. 3 performs control processing for recovering the error in the data with a parity bit stored in the general purpose register 3 when the error detection signal output from the error correction device 100 is received.

The configuration of the error correction device 100 will be explained in further detail. FIG. 4 illustrates the configuration of the error correction device 100 of FIG. 3.

The error correction device 100 includes an ECC generator 110, an ECC register 120, an error detection signal obtaining unit 130, and an error detection/correction unit 140.

The ECC generator 110 fetches the data with a parity bit output from the functional unit 2 from a node A of FIG. 3 in order to store the result of the arithmetic processing in the general purpose register 3. Then, an ECC using for the SEC capability or the SECDED capability is generated from the entirety of the m bytes of information unit data that is included in the data with a parity bit. As will be described later in detail, in the present embodiment, it is noted that the ECC generator 110 does not generate an entire ECC necessary for the SEC capability or the SECDED capability, but generates part of an ECC and stores part of the generated ECC in the ECC register 120.

The ECC register 120 is a register in which part of the ECC generated by the ECC generator 110 is stored. The same number of registers as the general purpose registers 3 are prepared as the ECC registers 120 on a one-to-one basis. Once part of an ECC is generated from the data with a parity bit, the ECC generator 110 stores part of the generated ECC in the ECC register 120 that is associated with the general purpose register 3 in which the data with a parity bit is stored.

The error detection signal obtaining unit 130 receives from a node B of FIG. 3 an error detection signal output from the 1-bit error detector 4, and the reception of the error detection signal triggers the operation of the error detection/correction unit 140.

By the trigger of the operation from the error detection signal obtaining unit 130, the error detection/correction unit 140 detects and corrects an error in the information unit data of the data with a parity bit in which the error is detected by the 1-bit error detector 4.

In this detection and correction of an error, the error detection/correction unit 140 firstly reads from the general purpose register 3 the data with a parity bit in which the error is detected by the 1-bit error detector 4. At the same time, the error detection/correction unit 140 reads part of the ECC stored in the ECC register 120 that is associated with the general purpose register 3 in which the relevant data with a parity bit was stored. Then, the SEC or the SECDED is performed for the information unit data included in the relevant data with a parity bit by using the parity bit attached to the data with a parity bit as well as part of an ECC read from the ECC register 120.

When the error detection/correction unit 140 corrects an error, the error detection/correction unit 140 stores the corrected data in the data with a parity bit of the general purpose register 3 in which the error was detected. Note that if uncorrectable 2 error bits are detected in cases where the SECDED capability is being performed, the error correction device 140 outputs an error detection signal that indicates the detection of the data error.

Next, a technique of detecting and correcting a data error with the use of the error correction device 100 of FIG. 3 will be explained below.

Generally, a normal Hamming Code is used for detecting and correcting a data error, thereby realizing the SEC capability or the SECDED capability. Firstly, the detection and correction of a data error with the use of a normal Hamming code will be briefly explained such that the technique of detecting and correcting a data error with the use of the error correction device 100 will be easily understood.

It is assumed that all the matrix and vector spaces used in the explanation below are defined in the field $F_2=\{0, 1\}$. Accordingly, only the scalar "0" or "1" is used, and all the additions and operations may be replaced with XOR operations.

In the error correction where a Hamming code is used, a check matrix H and a generation matrix G are used. When u(=s+t) codeword bits are formed by s information bits and t check bits, a check matrix H is a matrix with t rows and u columns. Moreover, the generation matrix G is a matrix with s rows and u columns, where $HG^T=GH^T=0$ is satisfied and the generation matrix G is not zero. Note that GT and HT are the transposed matrices of the generation matrix G and the check matrix H, respectively.

If the codeword is a systematic code, the check matrix H and the generation matrix G are respectively expressed by a mathematical expression [1] below.

$$H=(A\ I_t)$$
$$G=(I_s\ A^T) \quad [1]$$

In the mathematical expression [1], "A" is a matrix with t rows and s columns, and "$A^T$" is the transposed matrix of the matrix A. Moreover, "$I_t$" and "$I_s$" indicate a t-th order unit matrix and an s-th order unit matrix, respectively.

If s information bits are expressed as s-th order row vector "a" where the value of each bit is the value of each component, a u-th order row vector c that indicates a codeword is generated by the operation of a mathematical expression [2] below where the generation matrix G is used.

$$c=aG \quad [2]$$

In the check of the codeword, the product of a u-th order row vector c' that indicates a codeword to be checked and a check matrix H is calculated. If there are no errors in the row vector c', c'=c and a mathematical expression [3] below holds.

$$c'H^T=aGH^T=0 \quad [3]$$

In other words, when the product of the row vector c' and the transposed matrix of the check matrix H is a zero vector, it becomes apparent that there are no errors in the codeword to be checked.

Here, cases in which the value of an i-th bit in the codeword to be checked are different from the original codeword (i.e., the value of a bit is inverted) are considered.

Such cases may be expressed as $c'=c+e_i$, where the row vector $e_i$ is a u-th order fundamental vector of which only the value of an i-th component is "1". The product of the row vector c' and the transposed matrix of the check matrix H is expressed as a mathematical expression [4] below.

$$c'H^T=aGH^T+e_iH^T=e_iH^T \quad [4]$$

The right side of the mathematical expression [4] indicates a row vector that is obtained by inverting an i-th row of the check matrix H. Accordingly, if the position of a column that matches the column vector obtained by inverting the row vector is found in the check matrix H, it becomes possible to specify the position of an error bit in the codeword to be checked, and it also becomes possible to correct the error by inverting the value of the specified bit. Note that it is necessary for the columns of the check matrix H to be different from each other such that only one column that matches the column vector is found in the check matrix H. Moreover, it is also necessary that there be no columns in which all the components are zero in the check matrix H because it is impossible to distinguish from cases in which there are no errors in the codeword to be checked if there is a column in which all the components are zero in the check matrix H.

The number of bits t in the check bit required for performing detection and correction on 1 error bit in s information bits with the use of a Hamming code is $t=\lceil \log_2(s+1) \rceil$ (n.b., function "[x]" indicates the smallest integer that is equal to or larger than "x").

The above-described Hamming code is used for realizing the SEC capability. An exclusive-OR operation is performed on each bit of the u codeword bits, which is obtained by generating the Hamming code, to generate 1 parity bit, and a parity check on the codeword and the SEC with the use of the Hamming code are performed, thereby realizing the SECDED capability. The SECDED capability that is realized in such a way as above is referred to as an extended Hamming code (Enhanced Hamming Code). The number of bits t in the check bit required for realizing the SECDED capability with the use of an extended Hamming code is $t=\lceil \log_2(s+1) \rceil+1$.

On the basis of the explanation of a Hamming code above, the technique of detecting and correcting a data error with the use of the error correction device 100 will be explained.

In the error correction device 100, m bits of the ECC used for detecting and correcting an error in m*n bits of information unit data match the parity bit of each of m bytes of byte data constituting the information unit data. Firstly, the check matrix H for cases in which a data error is detected and corrected as above will be explained.

In the error correction device 100, the check matrix H as defined by a mathematical expression [5] below is used.

$$H = \begin{pmatrix} A_{(0)} & A_{(1)} & A_{(2)} & \ldots & A_{(m-2)} & A_{(m-1)} & I_m & O_1 \\ B_{(0)} & B_{(1)} & B_{(2)} & \ldots & B_{(m-2)} & B_{(m-1)} & O_2 & I_d \end{pmatrix} \quad [5]$$

This check matrix H is used for checking a codeword (data with ECC) that is constituted by the above-described m*n bits of information unit data and an ECC for the information unit data. Here, it is assumed that the number of bits of the portions other than m parity bits in the ECC is "d". Accordingly, the number of bits k of the ECC is k=m+d in this case, and the number of bits of the data with ECC is "m*n+m+d".

Moreover, it is assumed that the value of "d" is $d=\lceil \log_2(n+1) \rceil$ when the SEC capability is realized. It is also assumed that the value of "d" is $d=\lceil \log_2(n+1) \rceil+1$ when the SECDED capability is realized.

In the mathematical expression [5], $I_m$ and $I_d$ and indicate an m-th order unit matrix and a d-th order unit matrix, and $O_1$ and $O_2$ indicate a zero matrix with m rows and d columns and a zero matrix with d rows and m columns, respectively. In other words, in the matrix of the mathematical expression [5], the elements constituted by $I_m$ and $I_d$ as well as $O_1$ and $O_2$ correspond to the unit matrix $I_t$ in the check matrix H of the mathematical expression [1] above.

On the other hand, in the matrix of the mathematical expression [5], the elements constituted by $A_{(i)}, \ldots, A_{(m-1)}$ and $B_{(0)}, \ldots, B_{(m-1)}$ correspond to the matrix A in the check matrix H of the mathematical expression [1] above.

In the mathematical expression [5], $A_{(i)}$ (where i=0, 1, 2, ..., m−1) is a matrix with m rows and n columns defined by the mathematical expression [6].

$$A_{(i)} = \underbrace{(e_{(i)}\ e_{(i)}\ e_{(i)}\ \ldots\ e_{(i)}\ e_{(i)})}_{n} m \quad [6]$$

In the mathematical expression [6], $e_{(i)}$ is an m-th order column vector, and is a fundamental vector where only the value of an i-th component is "1" when the first row is the 0-th row. Accordingly, each component of $A_{(i)}$ in the mathematical expression [6] is expressed as a mathematical expression [7] below.

$$A_i = \begin{pmatrix} 000 & \ldots & 00 \\ 000 & \ldots & 00 \\ \vdots & & \\ 111 & \ldots & 11 \\ \vdots & & \\ 000 & \ldots & 00 \end{pmatrix} \underbrace{\phantom{000 \ldots 00}}_{n} \Big\} m \qquad [7]$$

If the mathematical expression [7] is used as the components of $A_{(i)}$ in the mathematical expression [5], m bits of the ECC come to match the parity bit of each m bytes of byte data constituting the information unit data. Moreover, as $A_{(i)}$, $I_m$, $I_d$, $O_1$, and $O_2$ in the mathematical expression [5] are defined as above, one of the two conditions, i.e., there is no column of which all the components are zero, required for the check matrix H is satisfied.

In the mathematical expression [5], $B_{(i)}$ (where i=0, 1, 2, ..., m−1) is defined such that the other condition out of the two conditions, i.e., the columns of the check matrix H are different from each other, is satisfied. In particular, $B_{(i)}$ is defined as in a mathematical expression [8] below.

$$B_{(i)} = ( \underbrace{b_{(0)} \quad b_{(1)} \quad b_{(2)} \quad \ldots \quad b_{(n-2)} \quad b_{(n-1)}}_{n} ) \} d \qquad [8]$$

It is assumed that when the SEC capability is realized, each of $b_{(i)}$ and $b_{(j)}$ in the mathematical expression [8] is a d-th order column vector that is not a zero vector and is linearly independent in any integer "i" and "j" (where i≠j, and 0≤i≤n−1 and 0≤j≤n−1). Moreover, it is also assumed that when the SECDED capability is realized, the number of components in which the value is "1" out of d components in all the d-th order column vectors $b_{(i)}$ is even.

Note that several Bs may meet such conditions. Next, specific examples of the check matrix H as defined above will be listed below.

Firstly, as the first example of the check matrix H, one example of the check matrix H in which the SEC capability is realized for 32 bits of information unit data where n=8 and m=4 is calculated.

Here, the value of "d" is $d=[\log_2(n+1)]=[\log_2(8+1)]=4$. In this case, the values of the components of the matrixes of $A_{(i)}$, $I_m$, $I_d$, and $O_2$ are determined as in a mathematical expression [9] below.

$$A_0 = \begin{pmatrix} 11111111 \\ 00000000 \\ 00000000 \\ 00000000 \end{pmatrix} A_{(1)} = \begin{pmatrix} 00000000 \\ 11111111 \\ 00000000 \\ 00000000 \end{pmatrix} A_{(2)} = \begin{pmatrix} 00000000 \\ 00000000 \\ 11111111 \\ 00000000 \end{pmatrix} \qquad [9]$$

$$A_{(3)} = \begin{pmatrix} 00000000 \\ 00000000 \\ 00000000 \\ 11111111 \end{pmatrix} O_1, O_2 = \begin{pmatrix} 0000 \\ 0000 \\ 0000 \\ 0000 \end{pmatrix} I_4 = \begin{pmatrix} 1000 \\ 0100 \\ 0010 \\ 0001 \end{pmatrix}$$

Regarding the matrix $B_{(i)}$, in this example, a matrix B of which the components are indicated in a mathematical expression [10] below is used for all of $B_1$, $B_2$, $B_3$, and $B_4$.

$$B = \begin{pmatrix} 10001001 \\ 01001100 \\ 00100110 \\ 00010011 \end{pmatrix} \qquad [10]$$

In this matrix B of the mathematical expression [10], column vectors are not zero vectors but are linearly independent from each other, and thus these vectors satisfy the above-described conditions of $B_{(i)}$ for realizing the SEC capability.

If the values of the mathematical expression [9] and the mathematical expression [10] above are substituted into the mathematical expression [5], a check matrix H of which the values are indicated in a mathematical expression [11] below is obtained.

$$H = \begin{pmatrix} 11111111 & 00000000 & 00000000 & 00000000 & 1000 & 0000 \\ 00000000 & 11111111 & 00000000 & 00000000 & 0100 & 0000 \\ 00000000 & 00000000 & 11111111 & 00000000 & 0010 & 0000 \\ 00000000 & 00000000 & 00000000 & 11111111 & 0001 & 0000 \\ 10001001 & 10001001 & 10001001 & 10001001 & 0000 & 1000 \\ 01001100 & 01001100 & 01001100 & 01001100 & 0000 & 0100 \\ 00100110 & 00100110 & 00100110 & 00100110 & 0000 & 0010 \\ 00010011 & 00010011 & 00010011 & 00010011 & 0000 & 0001 \end{pmatrix} \qquad [11]$$

Secondly, as the second example of the check matrix H, one example of the check matrix H in which the SECDED capability is realized for 32 bits of information unit data where n=8 and m=4 is calculated.

Here, the value of "d" is $d=[\log_2(n+1)]+1=[\log_2(8+1)]+1=5$. In this case, the values of the components of the matrixes of $A_{(i)}$, $I_n$, $I_d$, $O_1$, and $O_2$ are determined as in a mathematical expression [12] below.

$$A_0 = \begin{pmatrix} 11111111 \\ 00000000 \\ 00000000 \\ 00000000 \\ 00000000 \end{pmatrix} A_{(1)} = \begin{pmatrix} 00000000 \\ 11111111 \\ 00000000 \\ 00000000 \\ 00000000 \end{pmatrix} A_{(2)} = \begin{pmatrix} 00000000 \\ 00000000 \\ 11111111 \\ 00000000 \\ 00000000 \end{pmatrix} \qquad [12]$$

$$A_{(3)} = \begin{pmatrix} 00000000 \\ 00000000 \\ 00000000 \\ 00000000 \\ 11111111 \end{pmatrix} O_1 = \begin{pmatrix} 0000 \\ 0000 \\ 0000 \\ 0000 \\ 0000 \end{pmatrix} O_2 = \begin{pmatrix} 0000 \\ 0000 \\ 0000 \\ 0000 \\ 0000 \\ 0000 \end{pmatrix}$$

$$I_4 = \begin{pmatrix} 1000 \\ 0100 \\ 0010 \\ 0001 \end{pmatrix} I_5 = \begin{pmatrix} 10000 \\ 01000 \\ 00100 \\ 00010 \\ 00001 \end{pmatrix}$$

Regarding the matrix $B_{(i)}$, in this example, a matrix B of which the components are indicated in a mathematical expression [13] below is used for all of $B_1$, $B_2$, $B_3$, and $B_4$.

$$B = \begin{pmatrix} 11100000 \\ 00011100 \\ 10010011 \\ 01001010 \\ 00100101 \end{pmatrix} \qquad [13]$$

In this matrix B of the mathematical expression [13], column vectors are not zero vectors but are linearly independent from each other, and further, the number of components in which the value is "1" out of the five components of each column vector are all even. Accordingly, this matrix B satisfies the above-described conditions of $B_{(i)}$ for realizing the SECDED capability.

If the values of the mathematical expression [12] and the mathematical expression [13] above are substituted into the mathematical expression [5], a check matrix H of which the values are indicated in a mathematical expression [14] below is obtained.

$$H = \begin{pmatrix} 11111111 & 00000000 & 00000000 & 00000000 & 1000 & 00000 \\ 00000000 & 11111111 & 00000000 & 00000000 & 0100 & 00000 \\ 00000000 & 00000000 & 11111111 & 00000000 & 0010 & 0000 \\ 00000000 & 00000000 & 00000000 & 11111111 & 0001 & 00000 \\ 11100000 & 11100000 & 11100000 & 11100000 & 0000 & 10000 \\ 00011100 & 00011100 & 00011100 & 00011100 & 0000 & 01000 \\ 10010011 & 10010011 & 10010011 & 10010011 & 0000 & 00100 \\ 01001010 & 01001010 & 01001010 & 01001010 & 0000 & 00010 \\ 00100101 & 00100101 & 00100101 & 00100101 & 0000 & 00001 \end{pmatrix} \quad [14]$$

Next, the technique of generating the portions other than m parity bits for m*n bits of information unit data in an ECC will be described.

Firstly, a vector in the field $F_2$ where m*n bits of information unit data are arranged in a single row will be discussed. As described above, the information unit data is m bytes of data where each byte is configured by n bits of data. Accordingly, the information unit data is expressed by an information vector V of a mathematical expression [15] below.

$$V = (v_0(0), v_0(1), \ldots, v_0(n-2), v_0(n-1), v_1(0), \ldots, v_1(n-1), \ldots, v_{m-1}(n-2), v_{m-1}(n-1)) \quad [15]$$

The value of each component $v_i(j)$ in the information vector V is "0" or "1" (i.e., an element of the field $F_2$).

Here, a byte vector $v_i$ is defined as in a mathematical expression [16] by separating the components $v_i(j)$ of the information vector V for each byte, and with the use of this byte vector, the information vector V is expressed as in a mathematical expression [17].

$$v_i = (v_i(0), v_i(1), \ldots, v_i(n-2), v_i(n-1)) \quad [16]$$

$$V = (v_0, v_1, \ldots, v_{m-1}) \quad [17]$$

Next, a vector Vp indicating the above-described data with a parity bit and a vector Vc indicating the data with ECC that is the information unit data to which an ECC used for the SEC capability or the SECDED capability is added are defined as in a mathematical expression [18] as vectors in the field $F_2$.

$$Vp = (V, P) = (V, p_0, p_1, \ldots, p_{m-2}, P_{m-1})$$

$$Vc = (V, C) = V, c_0, c_1, \ldots, c_{k-2}, c_{k-1}) \quad [18]$$

In the mathematical expression [18], "P" indicates a parity bit vector in which m parity bits in the data with a parity bit are arranged in a single row, and "$p_i$" indicates each component of the parity bit vector P. Moreover, "C" indicates an ECC vector in which k bits of ECC in the data with ECC are arranged in a single row, and "$c_i$" indicates each component of the ECC vector C.

In view of the definition of parity, each component $p_i$ of the parity bit vector P indicates the relationship between the components $v_i(j)$ of the information vector V and a mathematical expression [19] below.

$$p_i = v_i(0) + v_i(1) + \ldots + v_i(n-2) + v_i(n-1) \quad [19]$$

Note that the operator "+" in the mathematical expression [19] indicates the additions in the field $F_2$, i.e., an XOR operation. It is also assumed that in the following descriptions, the operator "+" indicates an XOR operation, and terms such as "addition" also indicate an XOR operation.

Moreover, in the following descriptions, the ECC vector C may be expressed as in a mathematical expression [20] below with the use of an m-th order row vector $C_1$ and a d-th order row vector $C_2$.

$$C = (C_1 C_2) \quad [20]$$

Next, the necessary and sufficient condition for the above-described data with ECC indicated as "vector Vc" to be generated by the check matrix H is to satisfy a mathematical expression [21] below.

$$H \cdot Vc^T = 0 \quad [21]$$

In the mathematical expression [21], "$Vc^T$" indicates a column vector that is obtained by inverting the above-described vector Vc, and "0" on the right side indicates a k-th order column vector that is a zero vector. Note that the mathematical expression [21] is apparent from the mathematical expression [3] above.

The left side of the mathematical expression [21] is modified as in a mathematical expression [22] below.

$$H \cdot Vc^T = \begin{pmatrix} A_{(0)} & A_{(1)} & A_{(2)} & \ldots & A_{(m-2)} & A_{(m-1)} & I_m & O_1 \\ B_{(0)} & B_{(1)} & B_{(2)} & \ldots & B_{(m-2)} & B_{(m-1)} & O_2 & I_d \end{pmatrix} \begin{pmatrix} V^T \\ C^T \end{pmatrix} \quad [22]$$

$$= \begin{pmatrix} A_{(0)} & A_{(1)} & A_{(2)} & \ldots & A_{(m-2)} & A_{(m-1)} \\ B_{(0)} & B_{(1)} & B_{(2)} & \ldots & B_{(m-2)} & B_{(m-1)} \end{pmatrix} \cdot V^T +$$

$$\begin{pmatrix} I_m & O_1 \\ O_2 & I_d \end{pmatrix} \cdot C^T$$

$$= \begin{pmatrix} A_{(0)} \\ B_{(0)} \end{pmatrix} \cdot v_0^T + \begin{pmatrix} A_{(1)} \\ B_{(1)} \end{pmatrix} \cdot v_1^T + \ldots + \begin{pmatrix} A_{(m-1)} \\ B_{(m-1)} \end{pmatrix} \cdot v_{m-1}^T +$$

$$\begin{pmatrix} I_m & O_1 \\ O_2 & I_d \end{pmatrix} \cdot C^T$$

On the right sides of the mathematical expression [22], a mathematical expression [23] and a mathematical expression [24] hold.

$$\begin{pmatrix} A_{(i-1)} \\ B_{(i-1)} \end{pmatrix} \cdot v_{i-1}^T = \begin{pmatrix} 000 & \ldots & 00 \\ 000 & \ldots & 00 \\ \vdots & & \\ 111 & \ldots & 11 \\ \vdots & & \\ 000 & \ldots & 00 \\ & B_{(i-1)} & \end{pmatrix} \cdot v_{i-1}^T \quad [23]$$

$$= \begin{pmatrix} 0 \\ 0 \\ \vdots \\ v_i(0) + v_i(1) + \ldots + v_i(n-2) + v_i(n-1) \\ \vdots \\ 0 \\ B_{(i-1)} \cdot v_{i-1}^T \end{pmatrix}$$

$$= \begin{pmatrix} 0 \\ 0 \\ \vdots \\ p_i \\ \vdots \\ 0 \\ B_{(i-1)} \cdot v_{i-1}^T \end{pmatrix}$$

-continued $$\begin{pmatrix} I_m & O_1 \\ O_2 & I_d \end{pmatrix} \cdot C^T = C^T = \begin{pmatrix} C_1^T \\ C_2^T \end{pmatrix} \quad [24]$$

Accordingly, a mathematical expression [25] below is obtained from the mathematical expression [22].

$$H \cdot Vc^T = \begin{pmatrix} p_0 \\ p_1 \\ \vdots \\ p_{m-1} \\ B_{(0)} \cdot v_0^T + B_{(1)} \cdot v_1^T + \ldots + B_{(m-1)} \cdot v_{m-1}^T \end{pmatrix} + \begin{pmatrix} C_1^T \\ C_2^T \end{pmatrix} \quad [25]$$

$$= \begin{pmatrix} p^T \\ B_{(0)} \cdot v_0^T + B_{(1)} \cdot v_1^T + \ldots + B_{(m-1)} \cdot v_{m-1}^T \end{pmatrix} + \begin{pmatrix} C_1^T \\ C_2^T \end{pmatrix}$$

The necessary and sufficient condition for the above-described data with ECC indicated as "vector Vc" to be generated by the check matrix H in the relationship between the mathematical expression [25] and the above-described mathematical expression [21] is to satisfy a mathematical expression [26] below.

$$\begin{pmatrix} C_1^T \\ C_2^T \end{pmatrix} = \begin{pmatrix} p^T \\ B_{(0)} \cdot v_0^T + B_{(1)} \cdot v_1^T + \ldots + B_{(m-1)} \cdot v_{m-1}^T \end{pmatrix} \quad [26]$$

If the relationship between both sides of the mathematical expression [26] is considered, it becomes apparent that a portion of the ECC (i.e., the portion indicated by the vector $C_1$) is m parity bits itself in the data with a parity bit, which is indicated by the parity bit vector P. It is also apparent that the remaining portion of the ECC (i.e., the portion indicated by the vector $C_2$) may be obtained by calculating the total sum (i.e., the total sum of i=1 to i=m−1) of the product of the matrix $B_{(i)}$ and i-th 1 byte data in the information unit data which is indicated by the byte vector $v_i$.

Here, the components of the ECC vector C are specifically calculated by substituting the above-described concrete example of the value of the matrix B into the mathematical expression [26].

Firstly, the components of the ECC vector C are calculated by substitution with the concrete example of the value of the matrix B (see mathematical expression [10]), which is used for calculating the above-described first example of the check matrix H (see mathematical expression [11]). The first example of the check matrix H is used for realizing the SEC capability for 32 bits of information unit data where n=8 and m=4.

To begin with, the components of the information vector V, the parity bit vector P, the ECC vector C, and the above described vector $C_1$ and vector $C_2$ in the present case are expressed as in a mathematical expression [27].

$$V = (v_0(0), v_0(1), \ldots, v_0(7), v(0), \ldots, v_3(6), v_3(7)) = (v_0, v_1, v_2, v_3)$$

$$P = (p_0, p_1, p_2, p_3)$$

$$C_1 = (c_0, c_1, c_2, c_3), C_2 = (c_4, c_5, c_6, c_6, c_7) \quad [27]$$

At this time, if the value of the matrix B of mathematical expression [10] and the components of the vectors of the mathematical expression [27] are substituted into the mathematical expression [26], a mathematical expression [28] is obtained as below.

$$\begin{pmatrix} c_0 \\ c_1 \\ c_2 \\ c_3 \\ c_4 \\ c_5 \\ c_6 \\ c_7 \end{pmatrix} = \begin{pmatrix} p_0 \\ p_1 \\ p_2 \\ p_3 \end{pmatrix} + \begin{pmatrix} 10001001 \\ 01001100 \\ 00100110 \\ 00010011 \end{pmatrix} \cdot \begin{pmatrix} v_0(0) \\ v_0(1) \\ v_0(2) \\ v_0(3) \\ v_0(4) \\ v_0(5) \\ v_0(6) \\ v_0(7) \end{pmatrix} + \begin{pmatrix} 10001001 \\ 01001100 \\ 00100110 \\ 00010011 \end{pmatrix} \cdot \begin{pmatrix} v_1(0) \\ v_1(1) \\ v_1(2) \\ v_1(3) \\ v_1(4) \\ v_1(5) \\ v_1(6) \\ v_1(7) \end{pmatrix} + \begin{pmatrix} 10001001 \\ 01001100 \\ 00100110 \\ 00010011 \end{pmatrix} \cdot \begin{pmatrix} v_2(0) \\ v_2(1) \\ v_2(2) \\ v_2(3) \\ v_2(4) \\ v_2(5) \\ v_2(6) \\ v_2(7) \end{pmatrix} + \begin{pmatrix} 10001001 \\ 01001100 \\ 00100110 \\ 00010011 \end{pmatrix} \cdot \begin{pmatrix} v_3(0) \\ v_3(1) \\ v_3(2) \\ v_3(3) \\ v_3(4) \\ v_3(5) \\ v_3(6) \\ v_3(7) \end{pmatrix}$$

$$= \begin{pmatrix} p_0 \\ p_1 \\ p_2 \\ p_3 \\ v_0(0) + v_0(4) + v_0(7) + v_1(0) + v_1(4) + v_1(7) + v_2(0) + v_2(4) + v_2(7) + v_3(0) + v_3(4) + v_3(7) \\ v_0(1) + v_0(4) + v_0(5) + v_1(1) + v_1(4) + v_1(5) + v_2(1) + v_2(4) + v_2(5) + v_3(1) + v_3(4) + v_3(5) \\ v_0(2) + v_0(5) + v_0(6) + v_1(2) + v_1(5) + v_1(6) + v_2(0) + v_2(4) + v_2(7) + v_3(2) + v_3(5) + v_3(6) \\ v_0(3) + v_0(6) + v_0(7) + v_1(3) + v_1(6) + v_1(7) + v_2(3) + v_2(6) + v_2(7) + v_3(3) + v_3(6) + v_3(7) \end{pmatrix} \quad [28]$$

Next, the components of the ECC vector C are calculated by substitution with the concrete example of the value of the matrix B (mathematical expression [13]) which is used for obtaining the second example of the check matrix H (see mathematical expression [14]). The second example of the check matrix H is used for realizing the SECDED capability for 32 bits of information unit data where n=8 and m=4.

To begin with, the components of the information vector V, the parity bit vector P, the ECC vector C, and the above described vector $C_1$ and vector $C_2$ in the present case are expressed as in a mathematical expression [29].

$$V=(v_0(0), v_0(1), \ldots, v_0(7), v(0), \ldots, v_3(6), v_3(7))=$$
$$(v_0, v_1, v_2, v_3)$$

$$P=(p_0, p_1, p_2, p_3)$$

$$C=(c_0, c_1, c_2, c_3, c_4, c_5, c_6, c_7, c_8)$$

$$C_1=(c_0, c_1, c_2, c_3), C_2=(c_4, c_5, c_6, c_7, c_8) \quad [29]$$

At this time, if the value of the matrix B of the mathematical expression [13] and the components of the vectors of the mathematical expression [29] are substituted into the mathematical expression [26], a mathematical expression [30] is obtained as below.

from left to right. In other words, in the mathematical expression [31], the subscripts of the components of the information vector V are rewritten in accordance with a mathematical expression [32] below.

$$v_i(j)=v_{i \times 8+j} \quad [32]$$

Note that in the mathematical expression [32], i and j are integers where $0 \le i \le 3$ and $0 \le j \le 7$.

If the mathematical expression [31] is substituted into the mathematical expression [28], a mathematical expression [33] is obtained as below for the components $c_4, c_5, c_6$, and $c_7$ of the vector $C_2$.

$$\begin{pmatrix} c_0 \\ c_1 \\ c_2 \\ c_3 \\ c_4 \\ c_5 \\ c_6 \\ c_7 \\ c_8 \end{pmatrix} = \begin{pmatrix} 11100000 \\ 00011100 \\ 10010011 \\ 01001010 \\ 00100101 \end{pmatrix} \cdot \begin{pmatrix} v_0(0) \\ v_0(1) \\ v_0(2) \\ v_0(3) \\ v_0(4) \\ v_0(5) \\ v_0(6) \\ v_0(7) \end{pmatrix} + \begin{pmatrix} 11100000 \\ 00011100 \\ 10010011 \\ 01001010 \\ 00100101 \end{pmatrix} \cdot \begin{pmatrix} v_1(0) \\ v_1(1) \\ v_1(2) \\ v_1(3) \\ v_1(4) \\ v_1(5) \\ v_1(6) \\ v_1(7) \end{pmatrix} + \begin{pmatrix} 11100000 \\ 00011100 \\ 10010011 \\ 01001010 \\ 00100101 \end{pmatrix} \cdot \begin{pmatrix} v_2(0) \\ v_2(1) \\ v_2(2) \\ v_2(3) \\ v_2(4) \\ v_2(5) \\ v_2(6) \\ v_2(7) \end{pmatrix} + \begin{pmatrix} 11100000 \\ 00011100 \\ 10010011 \\ 01001010 \\ 00100101 \end{pmatrix} \cdot \begin{pmatrix} v_3(0) \\ v_3(1) \\ v_3(2) \\ v_3(3) \\ v_3(4) \\ v_3(5) \\ v_3(6) \\ v_3(7) \end{pmatrix} \quad [30]$$

$$= \begin{pmatrix} p_0 \\ p_1 \\ p_2 \\ p_3 \\ v_0(0)+v_0(1)+v_0(2)+v_1(0)+v_1(1)+v_1(2)+v_2(0)+v_2(1)+v_2(2)+v_3(0)+v_3(1)+v_3(2) \\ v_0(3)+v_0(4)+v_0(5)+v_1(3)+v_1(4)+v_1(5)+v_2(3)+v_2(4)+v_2(5)+v_3(3)+v_3(4)+v_3(5) \\ v_0(0)+v_0(3)+v_0(6)+v_0(7)v_1(0)+v_1(3)+v_1(6)+v_1(7)v_2(0)+v_2(3)+v_2(6)+v_2(7)v_3(0)+v_3(3)+v_3(6)+v_3(7) \\ v_0(1)+v_0(4)+v_0(6)+v_1(1)+v_1(4)+v_1(6)+v_2(1)+v_2(4)+v_2(6)+v_3(1)+v_3(4)+v_3(6) \\ v_0(2)+v_0(5)+v_0(7)+v_1(2)+v_1(5)+v_1(7)+v_2(2)+v_2(5)+v_2(7)+v_3(2)+v_3(5)+v_3(7) \end{pmatrix}$$

Next, a specific example of the circuitry of the ECC generator 110 in the error correction device 100 of FIG. 4 will be described. Here, a circuit that realizes the logic of vector $C_2$, which is one of the ECC vectors C illustrated in the mathematical expression [28] and the mathematical expression [30], will be explained.

Firstly, an example of the circuitry of the ECC generator 110, which is used for realizing the SEC capability for 32 bits of information unit data where n=8 and m=4, will be described.

To begin with, the subscripts of the components of the information vector V that indicate m*n bits of information unit data are rewritten as in a mathematical expression [31] below.

$$V=(v_0(0), v_0(1), \ldots, v_0(7), v_1(0), \ldots, v_3(6), v_3(7))=$$
$$(v_0, v_1, \ldots, v_7, v_8, \ldots, v_{30}, v_{31}) \quad [31]$$

In the mathematical expression [31], the components whose subscripts are rewritten are associated with the components whose subscripts have not yet been rewritten in order $$\begin{pmatrix} c_4 \\ c_5 \\ c_6 \\ c_7 \end{pmatrix} = \quad [33]$$

$$\begin{pmatrix} v_0+v_4+v_7+v_8+v_{12}+v_{15}+v_{16}+v_{20}+v_{23}+v_{24}+v_{28}+v_{31} \\ v_1+v_4+v_5+v_9+v_{12}+v_{13}+v_{17}+v_{20}+v_{21}+v_{25}+v_{28}+v_{29} \\ v_2+v_5+v_6+v_{10}+v_{13}+v_{14}+v_{18}+v_{21}+v_{22}+v_{25}+v_{29}+v_{30} \\ v_3+v_6+v_7+v_{11}+v_{14}+v_{15}+v_{19}+v_{22}+v_{23}+v_{27}+v_{30}+v_{31} \end{pmatrix}$$

Figure 5:
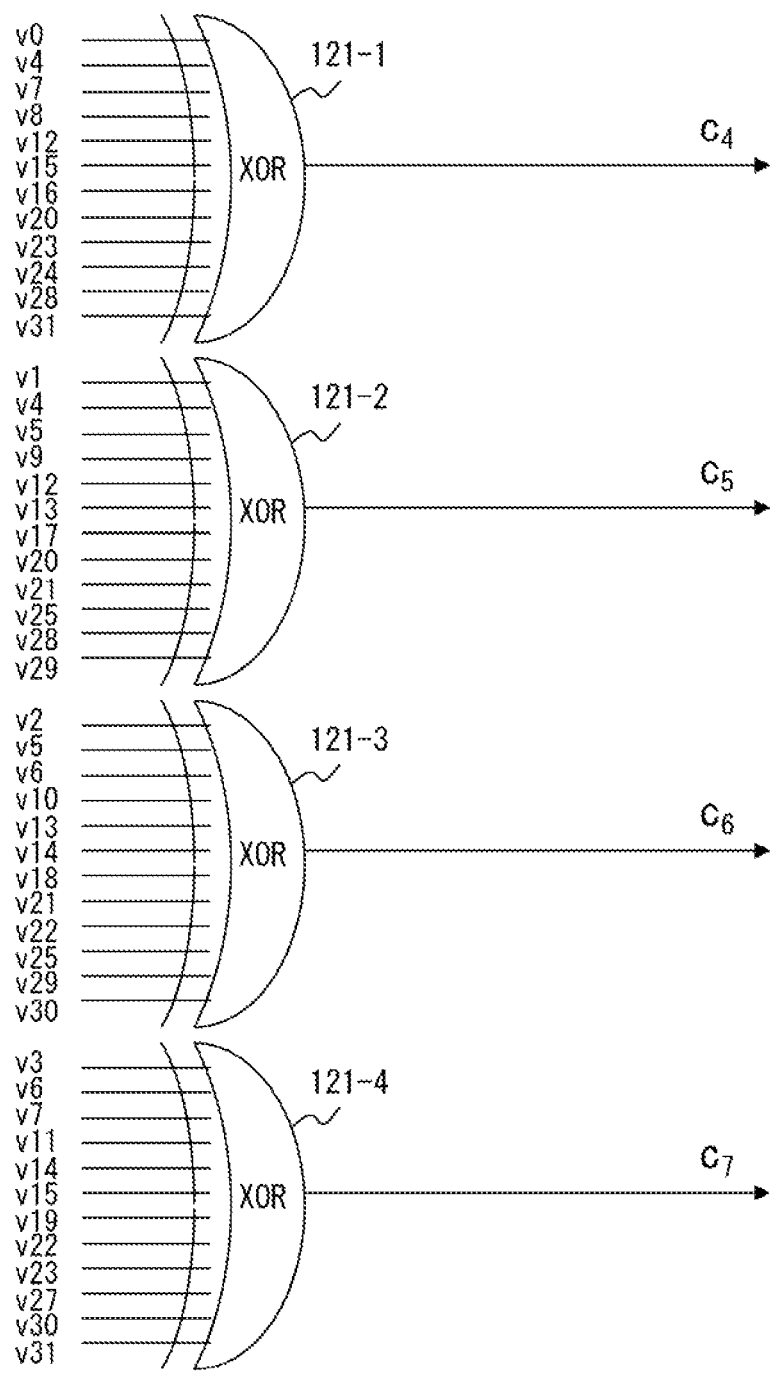
FIG. 5 illustrates the first example of the circuitry of an ECC generation circuit.

Here, FIG. 5 will be explained. FIG. 5 illustrates the first example of the circuitry of the ECC generator 110. This circuit realizes the logic of the components $c_4, c_5, c_6$, and $c_7$ of the vector $C_2$ in the mathematical expression [33] with the use of four XOR circuits 121-1, 121-2, 121-3, and 121-4. When data is corrected by using the SEC capability of the error correction device 100 of FIG. 3, the ECC generator 110 is configured to generate the components of the vector $C_2$ as a check bit by using the circuit of FIG. 5.

In this case, the error detection/correction unit 140 is configured to perform the above-described detection and correction by using the check matrix H of the mathematical expression [11].

Next, an example of the circuitry of the ECC generator 110, which is used for realizing the SECDED capability for 32 bits of information unit data where n=8 and m=4, will be described.

If the above-described mathematical expression [31] is substituted into the mathematical expression [30], a mathematical expression [34] is obtained as below for the components $c_4$, $c_5$, $c_6$, $c_7$, and $c_8$ of the vector $C_2$.

$$\begin{pmatrix} c_4 \\ c_5 \\ c_6 \\ c_7 \\ c_8 \end{pmatrix} = \begin{pmatrix} v_0 + v_1 + v_2 + v_8 + v_9 + v_{10} + v_{16} + v_{17} + v_{18} + v_{24} + v_{25} + v_{26} \\ v_3 + v_4 + v_5 + v_{11} + v_{12} + v_{13} + v_{19} + v_{20} + v_{21} + v_{27} + v_{28} + v_{29} \\ v_0 + v_3 + v_6 + v_7 + v_8 + v_{11} + v_{14} + v_{15} + v_{16} + v_{19} + v_{22} + v_{23} + v_{24} + v_{27} + v_{30} + v_{31} \\ v_1 + v_4 + v_6 + v_9 + v_{12} + v_{14} + v_{17} + v_{20} + v_{22} + v_{25} + v_{28} + v_{30} \\ v_2 + v_5 + v_7 + v_{10} + v_{13} + v_{15} + v_{18} + v_{21} + v_{23} + v_{26} + v_{29} + v_{31} \end{pmatrix} \quad [34]$$

Here, FIG. 6 will be explained. FIG. 6 illustrates the second example of the circuitry of the ECC generator 110. This circuit realizes the logic of the components $c_4$, $c_5$, $c_6$, $c_7$, and $c_8$ of vector $C_2$ in the mathematical expression [34] by using five XOR circuits 122-1, 122-2, 122-3, 122-4, and 122-5. When data is corrected by using the SECDED capability of the error correction device 100 of FIG. 3, the ECC generator 110 is configured to generate the components of the vector $C_2$ as a check bit by using the circuit of FIG. 6.

In this case, the error detection/correction unit 140 is configured to perform the above-described detection and correction by using the check matrix H of the mathematical expression [14].

Next, some advantages of the above-configured ECC generator 110 will be explained.

Figure 7:
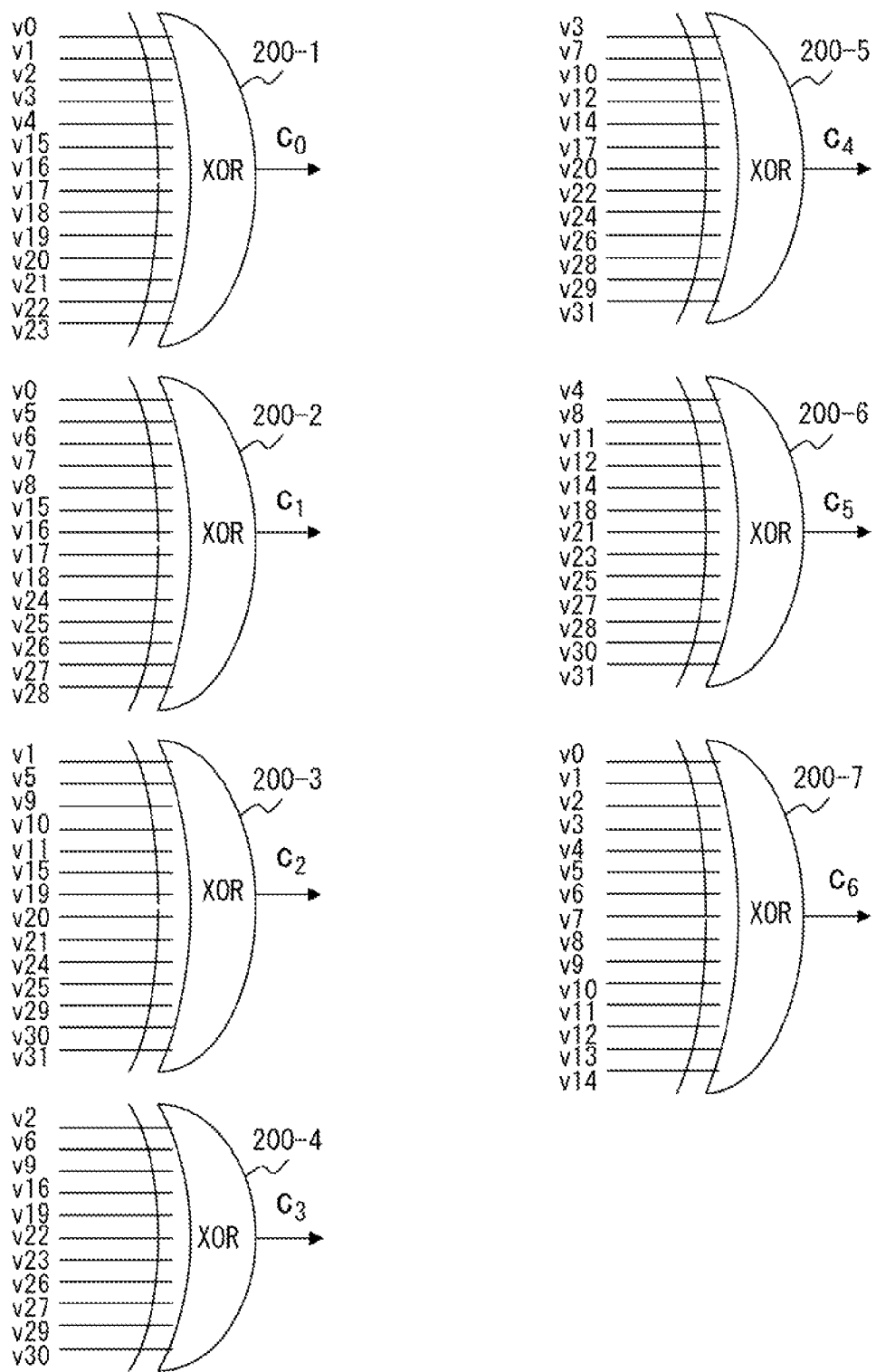
FIG. 7 illustrates an example of the circuitry of an ECC generation circuit in all cases in which the ECC used for the SECDED capability that normally uses an extended Hamming code is generated.

To begin with, FIG. 7 is presented for the purpose of comparison. FIG. 7 illustrates an example of the circuitry of the ECC generator 110 in cases where all the ECC used for the SECDED capability that normally uses the above-described extended Hamming code is generated, and FIG. 7 also relates to 32 bits of information unit data where n=8 and m=4.

In this case, the number of check bits required for realizing the SECDED capability is $[\log_2(32+1)]+1=7$ bits. The circuit of FIG. 7 generates 7 check bits by using seven XOR circuits 200-1 through 200-7.

As is apparent from the comparison between the circuits of FIG. 6 and FIG. 7, the circuit of FIG. 6 is smaller than that of FIG. 7. In other words, the circuit size of the error correction device 100 becomes small as the circuit of FIG. 6 is adopted as the ECC generator 110 to generate 5 of the check bits that is the ECC, and as a parity bit of the information unit data is applied to the other 4 bits.

It is noted that the reduction in the circuit size of the error correction device 100 is more prominent in the ECC register 120 than in the ECC generator 110. Some advantageous effects of the reduction of the circuit size of the ECC register 120 will be explained with reference to FIG. 8.

In FIG. 8, (A) schematically illustrates the circuit size of the ECC register 120 in cases where the parity bit for the information unit data is not used for the ECC and the circuit of FIG. 7 is adopted as the ECC generator 110. In this case, 7 check bits are generated by the ECC generator 110 for every 32 bits of information unit data, where n=8 and m=4, and thus a register as the ECC register 120 that stores 7 check bits for every information unit data becomes necessary.

On the other hand, in FIG. 8, (B) schematically illustrates the circuit size of the ECC register 120 in cases where the parity bit for the information unit data is used for the ECC and the circuit of FIG. 6 is adopted as the ECC generator 110. In this case, as 5 check bits are generated by the ECC generator 110 for every 32 bits of information unit data where n=8 and m=4, all that the ECC register 120 has to prepare is a register in which 5 check bits are stored for every information unit data. Accordingly, the ECC register 120 of (B) becomes smaller in circuit size than that of (A).

In the error correction device 100 of FIG. 4, the circuit size of the GPR register 120 occupies most of the error correction device 100. By way of example, the error correction device 100 (i.e., the circuit in which the SECDED capability is realized by using an extended Hamming code) was actually examined. As a result, the ratio of the number of transistors among the ECC generator 110, the ECC register 120, and the error detection/correction unit 140 was 15:3:1. For this reason, the reduction of the circuit size of the GPR register 120 significantly contributes to the reduction of the entirety of the circuit size of the error correction device 100.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An error correction device comprising:
an error correction code generator that generates, from information unit data of data with a parity bit which includes m bytes of information unit data in which each byte has n bits of data and a total of m parity bits where 1 bit is provided for every 1 byte of the information unit data, a bit other than a bit corresponding to the parity bit out of bits constituting an error correction code used for correcting an error in the information unit data;
an error detector that detects an error in the information unit data by generating an exclusive-OR of the data with a parity bit; and
an error corrector that corrects an error in the information unit data by using a parity bit included in the data with a parity bit and the bit generated by the error correction code generator when the error is detected in the information unit data by the error detector.

2. The error correction device according to claim 1, wherein the error correction code generator includes an exclusive-OR operation circuit that generates a value of a d-th order vector $C_2$ according to a mathematical expression $$C_2^T = B \cdot v_0^T + B \cdot v_1^T + \ldots + B \cdot v_{m-1}^T$$

(where "T" indicates an inversion of matrix, and "+" indicates an exclusive-OR operation), where n bits of data constituting an i-th byte of the information unit data of the data with a parity bit is expressed as a byte vector $v_i$ having n elements, that is, $v_i = (v_i(0), v_i(1), \ldots, v_i(n-2), v_i(n-1))$ and the information unit data of the data with a parity bit is expressed as an information vector V which has m byte vectors as an element, that is, $V = (v_0, v_1, \ldots, v_{m-1})$, and a matrix B is expressed as $B = (b_{(0)} b_{(1)} b_{(2)} \ldots b_{(n-2)} b_{(n-1)})$ (where each of $B_{(i)}$ and $b_{(j)}$ is a d-th order column vector that is not a zero vector and is linearly independent in any integer "I" and "j" (where $i \neq j$, and $0 \leq i \leq n-1$ and $0 \leq j \leq n-1$)).

3. The error correction device according to claim 2, wherein
the number of a value "1" in components of column vector $B_{(i)}$ in the matrix B is even in any integer I (where $0 \leq i \leq n-1$).

4. The error correction device according to claim 1, further comprising a partial storage unit that stores a bit generated by the error correction code generator,
wherein
the data with a parity bit is what a functional unit connected to the error correction device outputs to a register,
the error corrector corrects the error by using a parity bit of the data with a parity bit stored in the register and a bit stored in the partial storage unit.

5. A method for error correction, the method comprising:
generating, from information unit data of data with a parity bit which includes m bytes of information unit data in which each byte has n bits of data and a total of m parity bits where 1 bit is provided for every 1 byte of the information unit data, a bit other than a bit corresponding to the parity bit out of bits constituting an error correction code used for correcting an error in the information unit data;
detecting an error in the information unit data of the data with a parity bit by generating an exclusive-OR of the data with a parity bit; and
correcting an error in the information unit data of the data with a parity bit by using a parity bit included in the data with a parity bit and the generated bit when the error is detected in the information unit data of the data with a parity bit.

6. A processor comprising:
a functional unit that outputs data with a parity bit which includes m bytes of information unit data in which each byte has n bits of data and a total of m parity bits where 1 bit is provided for every 1 byte of the information unit data;
a register in which data with a parity bit output from the functional unit is stored;
an error detector that detects an error in the information unit data of the data with a parity bit read from the register by the functional unit by generating an exclusive-OR of the read data with a parity bit; and
an error correction device that corrects an error in the information unit data when the error is detected in the information unit data by the error detector, the error correction device including
an error correction code generator that generates, from the information unit data of the data with a parity bit stored in the register by the functional unit, a bit other than a bit corresponding to the parity bit out of bits constituting an error correction code used for correcting an error in the information unit data, and
an error corrector that corrects an error in the information unit data by using a parity bit included in the data with a parity bit and the bit generated by the error correction code generator.

7. The processor according to claim 6, wherein
the error correction code generator includes an exclusive-OR operation circuit that generates a value of a d-th order vector $C_2$ according to a mathematical expression $$C_2^T = B \cdot v_0^T + B \cdot v_1^T + \ldots + B \cdot v_{m-1}^T$$

(where "T" indicates an inversion of a matrix, and "+" indicates an exclusive-OR operation), where
n bits of data constituting an i-th byte of the information unit data of the data with a parity bit is expressed as a byte vector $v_i$ having n elements, that is, $v_i = (v_i(0), v_i(1), \ldots, v_i(n-2), v_i(n-1))$ and the information unit data of the data with a parity bit is expressed as an information vector V which has m byte vectors as an element, that is, $V = (v_0, v_1, \ldots, v_{m-1})$, and a matrix B is expressed as $B = (b_{(0)} b_{(1)} b_{(2)} \ldots b_{(n-2)} b_{(n-1)})$ (where each of $B_{(i)}$ and $b_{(j)}$ is a d-th order column vector that is not a zero vector and is linearly independent in any integer "I" and "j" (where $i \neq j$, and $0 \leq i \leq n-1$ and $0 \leq j \leq n-1$)).

8. The processor according to claim 7, wherein
the number of a value "1" in components of column vector $B_{(i)}$ in the matrix B is even in any integer I (where $0 \leq i \leq n-1$).

9. The processor according to claim 6, further comprising a partial storage unit that stores a bit generated by the error correction code generator,
wherein
the error corrector corrects the error by using a parity bit of the data with a parity bit stored in the register and a bit stored in the partial storage unit.

* * * * *